(12) United States Patent
Ogino

(10) Patent No.: US 8,048,600 B2
(45) Date of Patent: Nov. 1, 2011

(54) PARAMETER EXTRACTING METHOD

(75) Inventor: Kozo Ogino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1677 days.

(21) Appl. No.: 11/261,790

(22) Filed: Oct. 31, 2005

(65) Prior Publication Data

US 2007/0021938 A1 Jan. 25, 2007

(30) Foreign Application Priority Data

Jul. 21, 2005 (JP) ................................. 2005-211042

(51) Int. Cl.
*G03F 9/00* (2006.01)
(52) U.S. Cl. .......................................... 430/30; 430/942
(58) Field of Classification Search ..................... 430/30, 430/942
See application file for complete search history.

(56) References Cited

FOREIGN PATENT DOCUMENTS

| JP | 2003-218014 | * | 7/2003 |
| JP | 2005-101501 | | 4/2005 |

OTHER PUBLICATIONS

English translation of JP Publication 2003-218014, Jul. 2003.*

* cited by examiner

*Primary Examiner* — Cynthia Kelly
*Assistant Examiner* — Brittany Raymond
(74) *Attorney, Agent, or Firm* — Fujitsu Patent Center

(57) ABSTRACT

A parameter extracting method capable of accurately and effectively extracting parameters used for charged particle beam exposure. The method comprises the steps of forming an unknown parameter layer on a known parameter layer, forming a resist on the unknown parameter layer, subjecting the resist to exposure through patterns changed in an existing range, and extracting parameters of the unknown parameter layer using the exposure result. In the parameter extraction method, parameters of layers lower than the unknown parameter layer are known. Therefore, layer combinations to be considered and the number of experimental data can be drastically reduced. After parameter extraction of the unknown parameter layer, an unknown parameter layer is newly formed on the layer. Then, the parameter thereof is extracted in the same manner. Thus, the parameter is extracted sequentially from lower layers and therefore, the parameter in the multitiered structure having various layer combinations can be accurately and effectively extracted.

7 Claims, 15 Drawing Sheets

PARAMETER EXTRACTING METHOD

CROSS-REFERENCE TO RELATED APPLICATIONS

This application is based upon and claims the benefits of priority from the prior Japanese Patent Application No. 2005-211042, filed on Jul. 21, 2005, the entire contents of which are incorporated herein by reference.

BACKGROUND OF THE INVENTION

1. Field of the Invention

The present invention relates to a parameter extracting method. More particularly, the present invention relates to an extracting method of a proximity effect correction parameter used for charged particle beam exposure using electron beams.

2. Description of the Related Art

At present, direct drawing exposure by electron beams is used as one of key technologies in producing engineering samples for mass-production of semiconductor devices. When performing exposure using a mask, reedition is often performed particularly in design of multilayer wiring layers. Therefore, the EB direct drawing exposure technology capable of performing exposure without using a mask is extremely effective in view of cost or TAT (Turn Around Time).

It is generally known that in the electron beam exposure, a resolution line width changes depending on a density of an exposure pattern due to a proximity effect. Therefore, influences of the proximity effect are calculated based on the EID (Exposure Intensity Distribution) function to perform the proximity effect correction for optimizing an exposure amount to or size of each pattern so that the same absorbed energy can be finally obtained in each pattern. For example, when a resist in which a pattern is formed is formed on a substrate composed of a single material, the EID function can be empirically represented by the following formula (1):

$$f(x, y) = \frac{1}{\pi(1+\eta)}\left\{\frac{1}{\beta_f^2}\exp\left(-\frac{x^2+y^2}{\beta_f^2}\right) + \frac{\eta}{\beta_b^2}\exp\left(-\frac{x^2+y^2}{\beta_b^2}\right)\right\} \quad (1)$$

In the formula (1), $\beta_f$ is a forward scattering length, $\eta$ is a backward scattering ratio and $\beta_b$ is a backward scattering length. A first term represents a forward scattering intensity distribution and a second term represents a backward scattering intensity distribution. Forward scattering has a large effect on a narrow range. On the contrary, backward scattering has a relatively small effect on a wide range. The backward scattering ratio $\eta$ is a ratio of a value obtained by integrating influences of the backward scattering in a specific region to that of the forward scattering.

In order to form a pattern having high dimensional accuracy, the selection of $\beta_f$, $\eta$ and $\beta_b$ of the formula (1) is important. Conventionally, also a method for extracting the $\beta_f$, $\eta$ and $\beta_b$ most suitable for the proximity effect correction is proposed (see, e.g., Japanese Unexamined Patent Application Publication No. 2003-218014).

In recent years, when actually performing electron beam exposure, a multitiered structure comprised of various materials, such as a wiring layer or a contact hole layer is formed under a resist in many cases. For example, when forming the wiring layer, Al or Cu is used for a wiring and $SiO_2$ is used between wirings. Further, when forming the contact hole layer, W or Cu is used for a via and $SiO_2$ is used between vias.

A heavy metal typified by W is easy to reflect electrons and therefore, is difficult for electrons to be transmitted. On the other hand, a relatively light substance such as Al or $SiO_2$ reflects a small number of electrons and therefore, is easy for electrons to be transmitted. Accordingly, even within the same layer, a scattering state of electrons considerably varies depending on the types of materials constituting the layer. Further, an electron transmitted through a layer enters a lower layer. Also in the lower layer, the scattering state of electrons varies depending on the types of materials constituting the layer. On the other hand, also in a process where an electron which deeply enters returns to a resist, the electron is reflected by a heavy metal within a halfway layer (a screening effect) and therefore, the number of electrons that reach the resist is extremely reduced, as compared with a case where a heavy metal is absent.

As described above, the scattering state of electrons in the multitiered structure is extremely complicated. Therefore, the proximity effect cannot be simply estimated by using the EID function of the formula (1). More specifically, in the case of the multitiered structure, an influence of the backward scattering actually varies depending on a combination of layers constituting the structure. In spite of the fact, when using the formula (1) excluding the combination of layers, the backward scattering intensities are computationally equalized irrespective of the combination of the layers.

On the other hand, also a technique for calculating an influence of the backward scattering while considering the combination of the layers under the resist is conventionally proposed (see, e.g., Japanese Unexamined Patent Application Publication No. 2005-101501). This proposal is as follows. That is, in each of the layers, a parameter such as a reflection coefficient, a transmission coefficient or a diffusion length is defined for each of the construction materials of the layers. Further, weighing is performed using an area density (a share) of each construction material to calculate a stream of electrons within the layers, in other words, a stream of energy.

FIG. 15 illustrates a principle of a conventional calculation technique of the backward scattering intensity.

As shown in FIG. 15, the following case is supposed. That is, on a substrate (a zeroth layer), (N−1) layers (from a first layer to an (N−1)th layer) are sequentially laminated and then, a resist (an Nth layer) as an uppermost layer is formed. Further, a stream of energy (a stream of electrons) is herein considered as follows.

As indicated by arrows in FIG. 15, electrons of energy (or the number of electrons) $E_N$ are first transmitted through the resist to enter an (N−1)th layer. Among them, electrons of energy $E_{N-1}$ corresponding to a transmission coefficient $T_{N-1}$ are transmitted through the (N−1)th layer to enter an (N−2)th layer, and electrons of energy $E_{N-1}'$ corresponding to a reflection coefficient $R_{N-1}$ are reflected from the (N−1)th layer to return to the resist. Further, among electrons of energy $E_{N-1}$, which are transmitted through the (N−1)th layer to enter the (N−2)th layer, electrons of energy $E_{N-2}$ corresponding to a transmission coefficient $T_{N-2}$ of the (N−2)th layer are transmitted through the (N−2)th layer to enter an (N−3)th layer, and electrons of energy $E_{N-2}'$ corresponding to a reflection coefficient $R_{N-2}$ of the (N−2)th layer are reflected from the (N−2)th layer. Thus, among electrons of energy $E_2$, which are transmitted through the second layer to enter the first layer, electrons of energy $E_1$ corresponding to a transmission coefficient $T_1$ of the first layer are transmitted through the first layer to enter the substrate, and electrons of energy $E_1'$ corresponding to a reflection coefficient $R_1$ of the first layer are reflected from the first layer. Further, among electrons of energy $E_1$, which are transmitted through the first layer to enter the substrate, electrons of energy $E_0'$ corresponding to a reflection coefficient $R_0$ of the substrate are reflected from the substrate.

On the other hand, among electrons of energy $E_0'$, electrons of energy $E_1''$ corresponding to the transmission coefficient $T_1$ of the first layer are transmitted through the first layer to enter the second layer. On this occasion, electrons of energy $E_1''$ as well as electrons of energy $E_1'$, which are reflected from the first layer, enter the second layer. Similarly, electrons of energy $E_{N-2}''$, which are transmitted through the (N−2)th layer, as well as electrons of energy $E_{N-2}'$, which are reflected from the (N−2)th layer, enter the (N−1)th layer. Finally, electrons of energy $E_{N-1}''$ corresponding to the transmission coefficient $T_{N-1}$, which are transmitted through the (N−1)th layer, as well as electrons of energy $E_{N-1}'$ corresponding to the reflection coefficient $R_{N-1}$, which are reflected from the (N−1)th layer, return to the resist.

Based on the stream of energy as described above, calculation is recursively performed from the uppermost layer to the lowermost layer, and the energy which finally returns to the resist is qualified as energy absorbed in the resist by the backward scattering. In this calculation technique, a transmission coefficient or reflection coefficient of each construction material is used to add reflection, transmission or screening effects of electrons, which are produced by each construction material of each layer. Therefore, the backward scattering intensity can be accurately calculated.

When calculating the backward scattering intensity of the multitiered structure using the above-described technique to perform proximity effect correction, the parameters such as a reflection coefficient, transmission coefficient or diffusion length of each construction material of each layer must be accurately extracted. These parameters are normally extracted using actual exposure results and calculation results. Further, the proximity effect correction of the objective pattern is performed using the thus obtained parameters. Then, exposure through the pattern is performed according to the correction.

However, in the case of the multitiered structure, numerous combinations of the layers are possible. Therefore, a long period of time is required for a work operation of experimentally performing exposure for all the combinations and extracting a parameter using the exposure result. For example, in the case of a three-layer structure where each layer is composed of two types of materials such as a W plug and an insulating film, when changing a share of the W plug in ten ways, 10×10×10=1000 combinations of the layers are possible. Further, the number of experimental data used for extracting each parameter becomes huge depending on the types of exposure patterns, for example, depending on the share or existing range of the pattern.

SUMMARY OF THE INVENTION

In view of the foregoing, it is an object of the present invention to provide a parameter extracting method for accurately and effectively extracting a proximity effect correction parameter used for charged particle beam exposure.

To accomplish the above object, according to one aspect of the present invention, there is provided a parameter extracting method for extracting a parameter used for exposure. This parameter extracting method comprises the steps of forming an unknown parameter layer on a known parameter layer, forming a resist on the unknown parameter layer, subjecting the resist to exposure through a pattern changed in an existing range, and extracting a parameter of the unknown parameter layer using the exposure result.

According to another aspect of the present invention, there is provided a parameter extracting method for extracting a parameter used for exposure. This parameter extracting method comprises the steps of:

forming a resist on a layer;

subjecting the resist to exposure through a pattern changed in an existing range;

extracting a parameter of the layer using the exposure result;

virtually dividing the layer; and treating as an unknown parameter layer an uppermost layer of the divided layer, and treating as a known parameter layer a layer lower than the unknown parameter layer to extract a parameter of the unknown parameter layer using the exposure result.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

A preferred embodiment of the present invention will be described in detail below with reference to the accompanying drawings by taking, by way of example, a case of applying the embodiment to electron beam exposure.

First, a first embodiment will be described.

Figure 1:
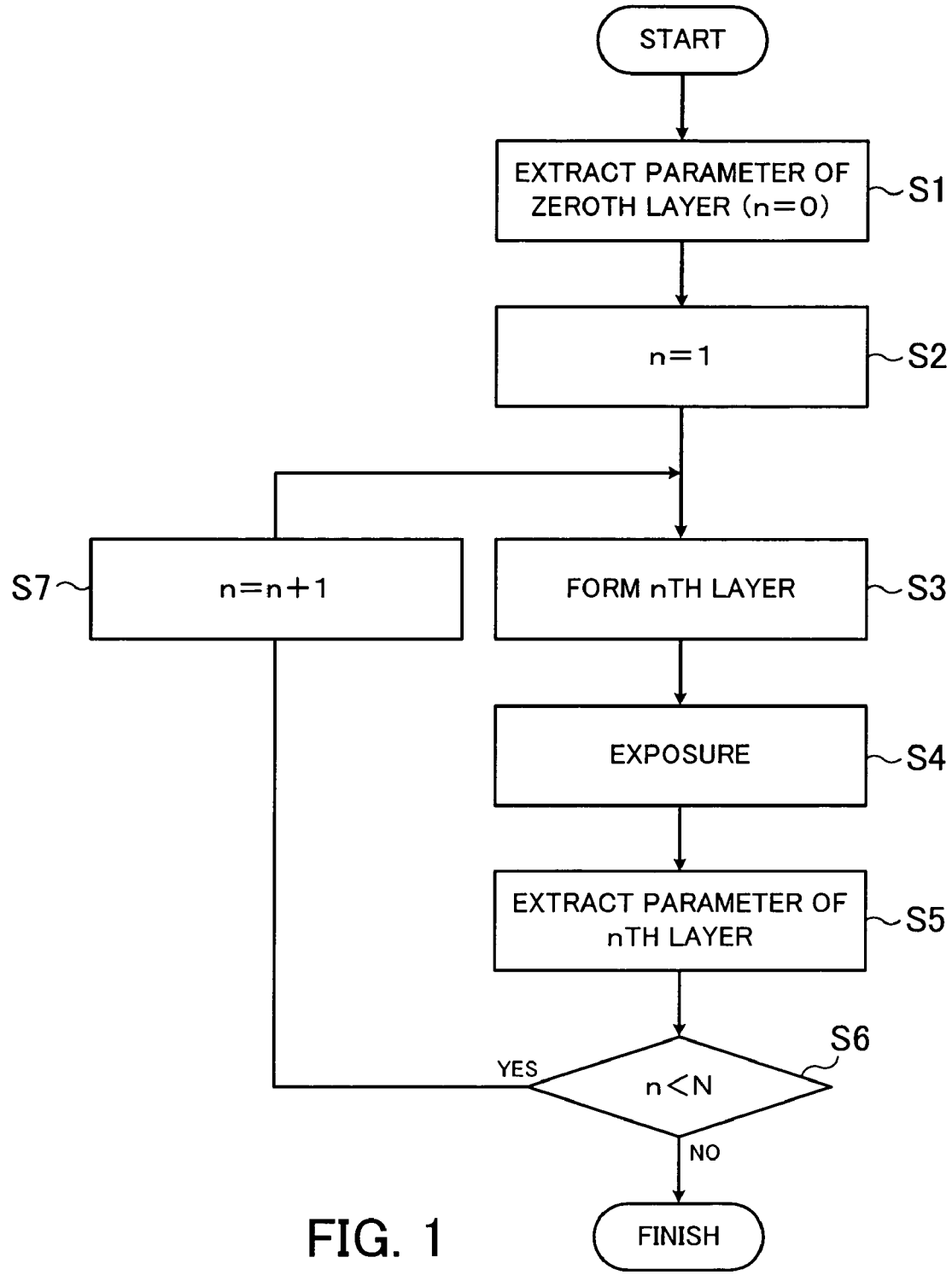
FIG. 1 illustrates an outline of a parameter extracting flow according to a first embodiment.

FIG. 1 illustrates an outline of a parameter extracting flow according to the first embodiment.

This parameter extracting method is used for extraction of parameters such as a reflection coefficient R, transmission coefficient T or diffusion length σ used for proximity effect correction when a multitiered structure is formed under a resist to be exposed.

This parameter extracting method is performed by the following process. That is, parameter extraction of a substrate (a zeroth layer (n=0)) is first performed (step S1). Further, a layer (a first layer (n=1)) changed in a share of the construction materials is formed on the substrate (steps S2 and S3). Then, the first layer is subjected to exposure through each pattern according to data (exposure pattern data) changed in an existing range of the pattern (step S4). From the exposure result, a parameter of each construction material of the first layer is extracted, for example, by applying a least-squares method to an experimental value and to a calculated value as described later (step S5). On this occasion, the previously extracted parameter of the substrate is used.

When the number of the layers at this time fails to meet the predetermined number of the layers N (step S6), a layer (a second layer (n=2)) changed in a share of the construction materials is newly formed on the first layer (steps S7 and S3). Then, in the same manner as in step S4, the second layer is subjected to exposure through each pattern according to the exposure pattern data changed in an existing range of the pattern. From the exposure result, a parameter of each construction material of the second newly formed layer is extracted (steps S4 and S5). On this occasion, the previously extracted parameters of the substrate and the first layer are used. This process is repeated by the number of the layers N (step S6) to extract the parameter of each construction material in each layer up to the Nth layer.

Thus, in this parameter extracting method, the parameter of each construction material of each layer in the multitiered structure is extracted sequentially from lower layers.

Herein, the exposure pattern data used for the evaluation are not one datum but the data changed in the existing range of the pattern. Therefore, a relation between a size of the existing range of the pattern and a backward scattering intensity in the pattern center can be obtained from the exposure result. Examples of the pattern shown by the exposure pattern data used in the parameter extracting method include those as shown in the following FIGS. 2 to 4.

Figure 2A:
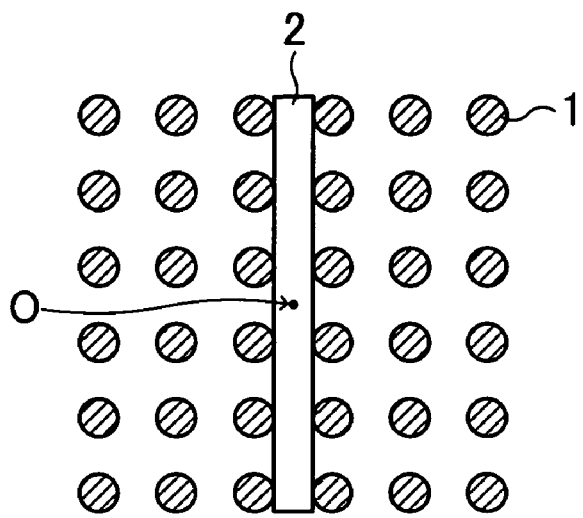
FIGS. 2A, 2B and 2C each show an essential part of a line and space pattern.
Figure 2B:
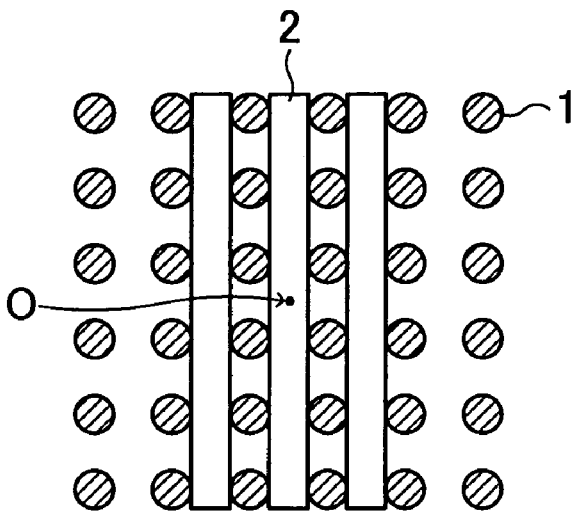
Figure 2C:
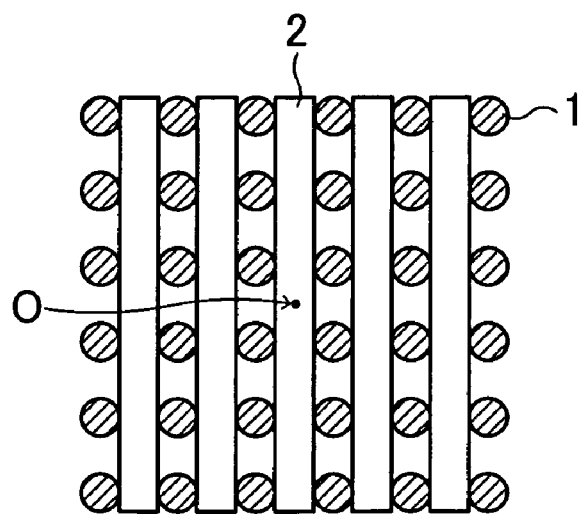
Figure 3A:
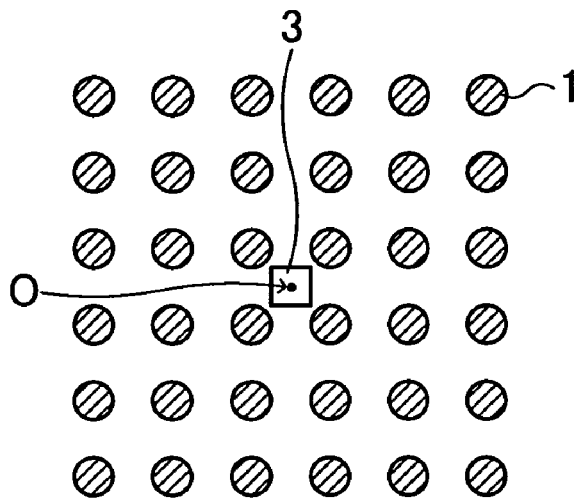
FIGS. 3A, 3B and 3C each show an essential part of a hole pattern.
Figure 3B:
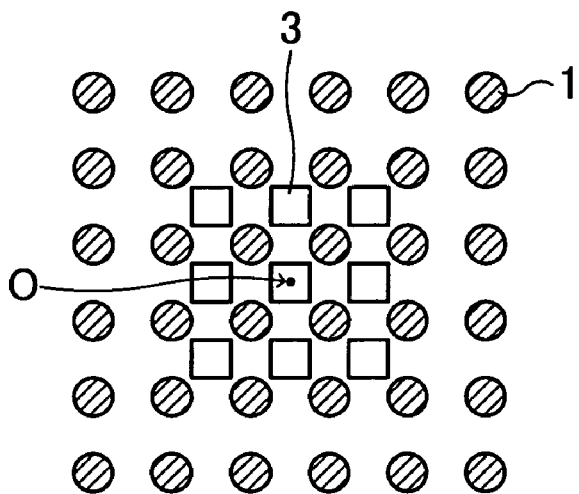
Figure 3C:
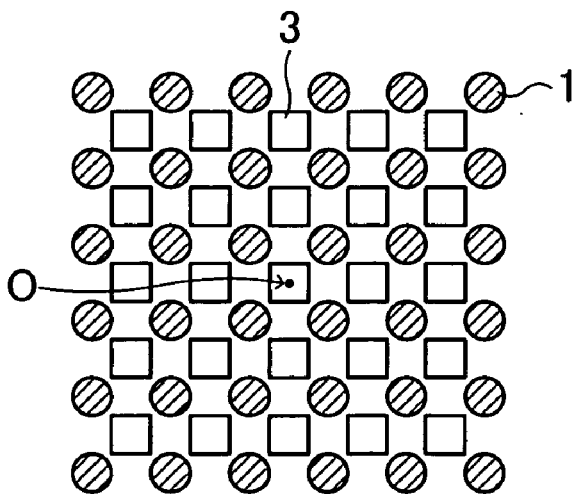
Figure 4A:
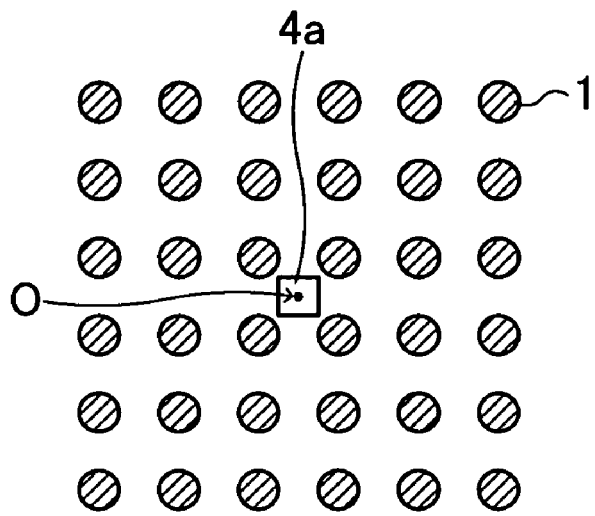
FIGS. 4A, 4B and 4C each show an essential part of a doughnut pattern.
Figure 4B:
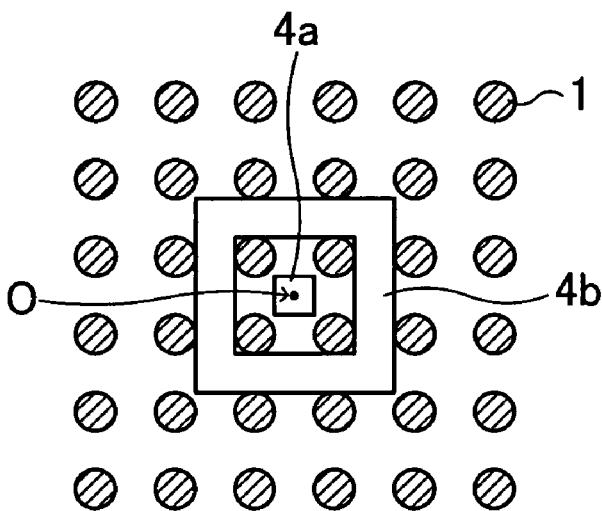
Figure 4C:
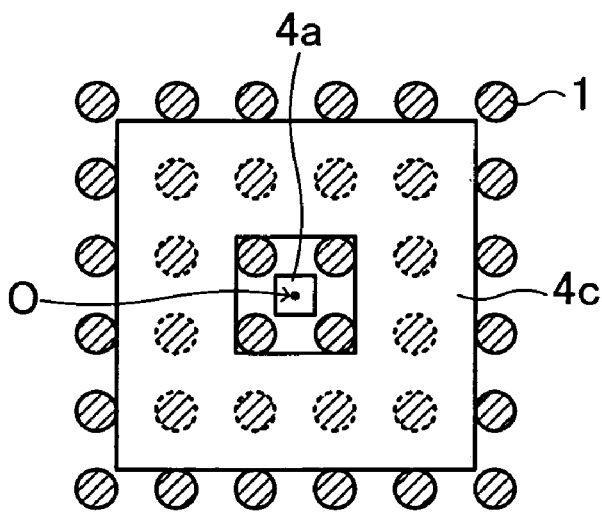

FIGS. 2A, 2B and 2C each show an essential part of a line and space pattern and show each pattern changed in the number of lines. FIGS. 3A, 3B and 3C each show an essential part of a hole pattern and show each pattern changed in the number of holes. FIGS. 4A, 4B and 4C each show an essential part of a doughnut pattern and show each pattern changed in a width of the doughnut pattern.

FIG. 2 shows a state where in the resist (not shown) on the layer composed of an insulating film and a W plug 1 formed in the film, a predetermined number of line patterns 2 is formed. FIG. 3 shows a state where in the resist (not shown) on the layer composed of an insulating film and a W plug 1 formed in the film, a predetermined number of hole patterns 3 is formed. FIG. 4 shows a state where in the resist (not shown) on the layer composed of an insulating film and a W plug 1 formed in the film, doughnut patterns 4b and 4c each having a predetermined width are formed to surround a square pattern 4a in the central portion. An arrangement of the W plug 1 changes depending on the share of the W plug 1. Further, an object of the W plug 1 is herein to change the share of the construction materials of the layer under the resist. Therefore, the arrangement of the W plug 1 is different from that within an actual device, and is regular.

When performing exposure using the exposure pattern data as described above, as the existing range of the pattern more increases, an influence of the backward scattering from a longer distance when two-dimensionally viewed is exerted. As a result, the backward scattering intensity is more added to the pattern center O. Therefore, when extracting the parameter of each construction material of a layer, the least-squares method is applied to the experimentally obtained backward scattering intensities in the pattern center O corresponding to the number of patterns and to the computationally obtained backward scattering intensities in the pattern center O corresponding to the number of patterns. As a result, the parameter of each construction material of the layer can be extracted. Further, the parameter extraction in view of an influence of the backward scattering from a long distance is enabled.

On the other hand, in a proximity effect correction model of the multitiered structure, electrons which enter from the resist are transmitted through or reflected from each layer to return to the resist while being scattered in each layer. Therefore, as an electron more deeply goes into each layer, the electron reaches farther when two-dimensionally viewed. In terms of the above-mentioned point, it can be said that in the parameter extraction in the multitiered structure, when extracting the parameter sequentially from lower layers, the parameter of each construction material of each layer can be more accurately obtained.

Thus, in the parameter extracting method according to the first embodiment, a parameter of each construction material of each layer is extracted sequentially from lower layers. Consequently, when extracting a parameter of a layer, parameters of the lower layers are already extracted. Therefore, when actually forming the multitiered structure, the need to change the share of the construction material of the lower layer is eliminated. Accordingly, in the method, a multitiered structure is used in which only a layer to be subjected to parameter extraction is changed in the share of the construction material. Further, the parameter of each construction material of the layer is extracted using suitable exposure pattern data and the proximity effect correction is performed using the obtained parameter of each layer. As a result, the correction for various multitiered structures can be performed accurately and effectively.

The parameter extracting method according to the first embodiment will be described in detail below.

Herein, description is made by taking the following case by way of example. That is, under a resist, a multitiered structure is formed by laminating on a Si substrate a layer composed of an insulating film and a W plug formed within the film. Then, a line and space pattern (L/S pattern) is formed in the resist to perform the parameter extraction.

In the following description, a reflection coefficient and diffusion length of the zeroth layer are represented by $R_0$ and $\sigma_0$, respectively. A reflection coefficient, transmission coefficient and diffusion length of the W plug in the nth layer are represented by $R_{A,n}$, $T_{A,n}$ and $\sigma_{A,n}$, respectively. A reflection coefficient, transmission coefficient and diffusion length of the insulating film in the nth layer are represented by $R_{B,n}$, $T_{B,n}$ and $\sigma_{B,n}$, respectively. Further, an experimentally obtained backward scattering intensity and computationally obtained backward scattering intensity in forming the resist on the nth layer are represented by $F_{n,k}$ and $F_n(k)$, respectively (provided that k is the number of lines in the L/S pattern).

In addition, the optimum exposure amount of the L/S pattern formed in the resist on the nth layer is represented by $Q_{n,k}$ (k is the number of lines). Further, a rate of electrons which enter one line pattern of the L/S pattern formed in the resist on the nth layer and are reflected to the L/S pattern center is represented by $g_n(x)$ and $h_n(x, \sigma^2)$ (provided that x is a distance from one line pattern center to the L/S pattern center).

Figure 5:
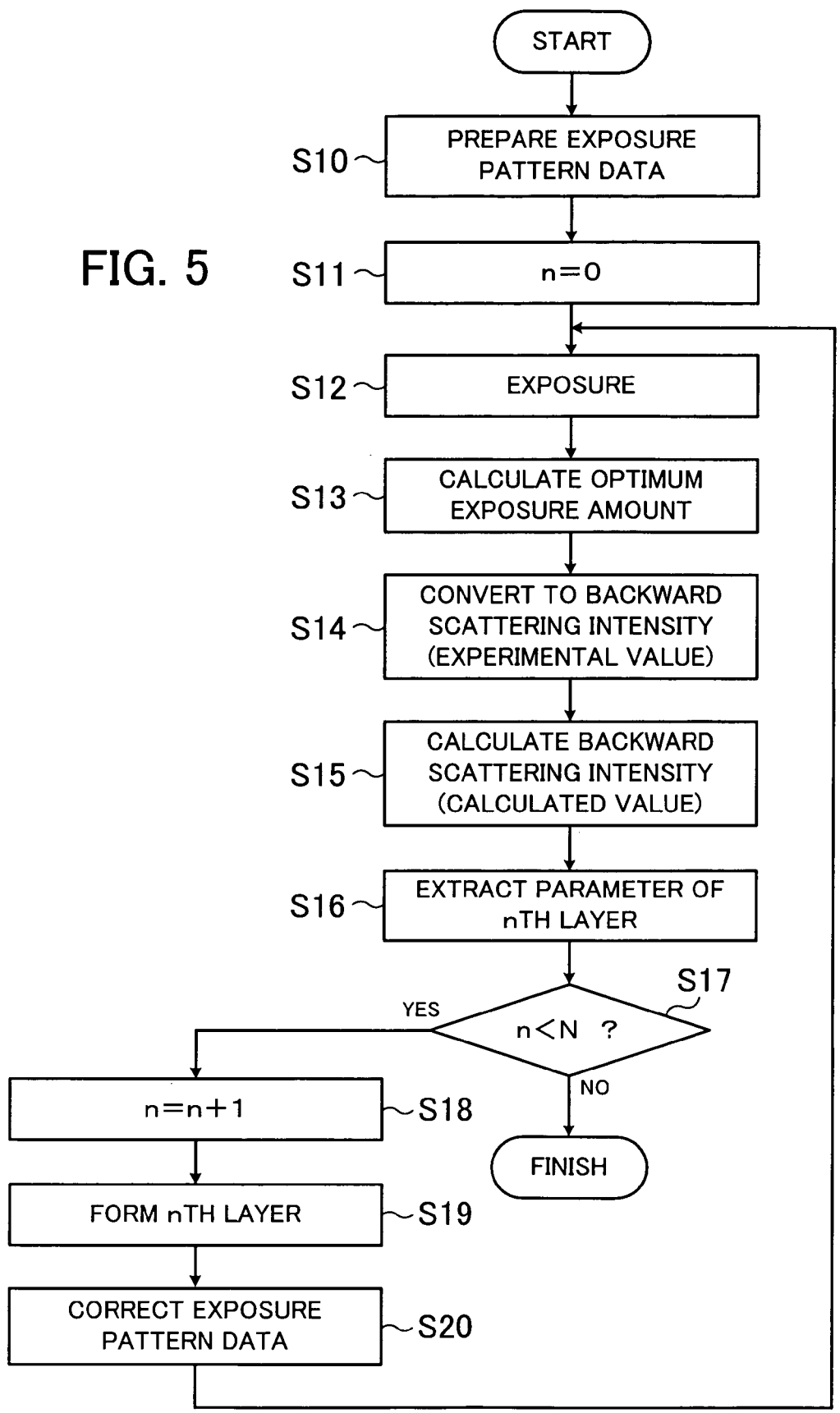
FIG. 5 shows a parameter extracting flow according to a first embodiment.

FIG. 5 shows a parameter extracting flow according to the first embodiment.

In the parameter extracting method, the exposure pattern data used for forming the pattern in the resist are first created (step S10). When a pattern to be formed is, for example, the L/S pattern, the exposure pattern data are created under conditions as shown in the following items (i), (ii) and (iii).

(i) The L/S pattern is configured by being changed in the number of lines k from one to several hundreds. For example, each L/S pattern having 1, 3, 5, 7, 9, 11, 13, 15, 21, 31, 51, 101 or 301 line patterns is configured.

(ii) A line width and space width of the L/S pattern are set to about three to five times the forward scattering length $\beta_f$. For example, when an estimated maximum value of the forward scattering length $\beta_f$ is 80 nm, the line width and space width of the L/S pattern are set to from 240 to 400 nm.

The reason why the line width of the L/S pattern is set to such a value is to saturate an influence of the forward scattering in an edge of each line pattern for allowing the forward scattering intensity in the edge to be constant. The reason why the space width of the L/S pattern is set to such a value is to prevent the forward scatterings of the patterns from overlapping with each other for allowing the backward scattering intensity within a space to be constant.

(iii) The line pattern is divided by a length of about 4 μm. By taking a pitch between the W plugs of the lower layer as a period, the respective line patterns are arranged while being shifted by bits. For example, the respective line patterns are arranged as shown in FIG. 6.

Figure 6:
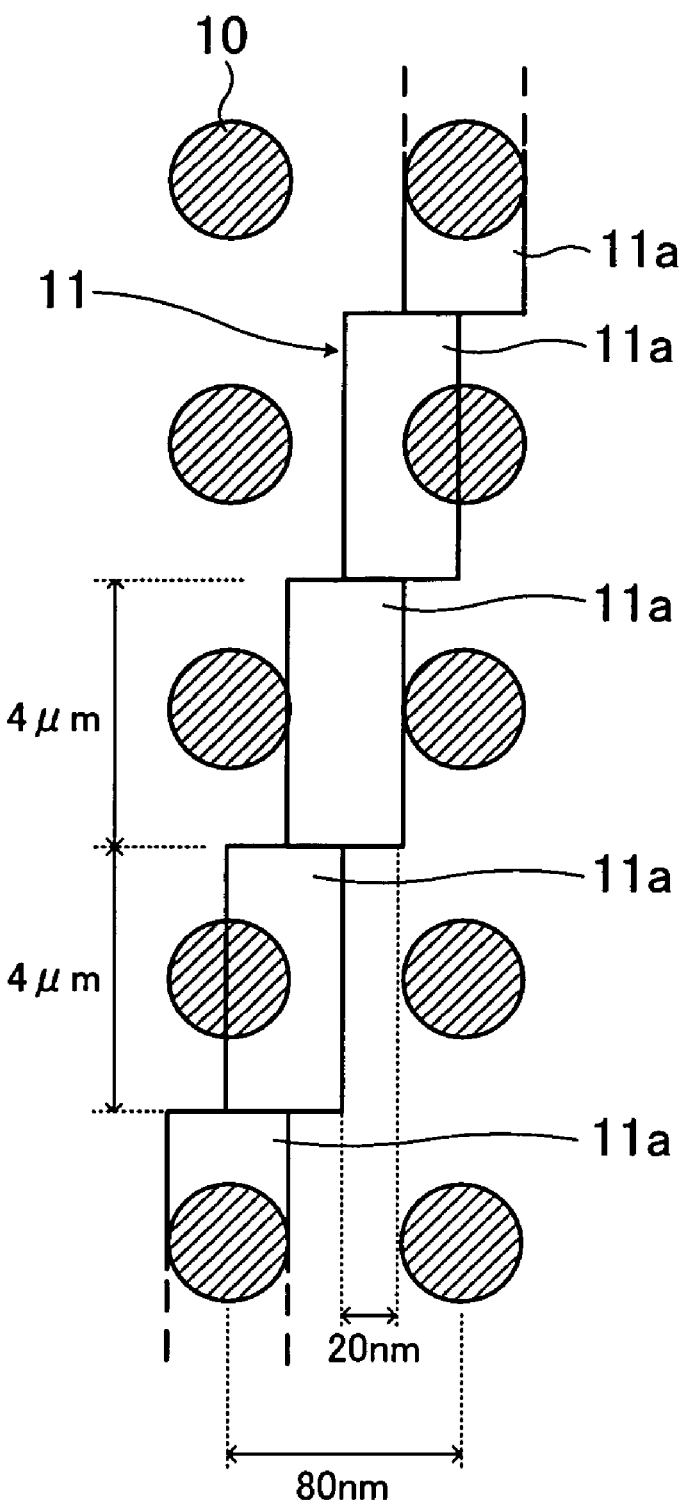
FIG. 6 shows an arrangement example of a line pattern.

FIG. 6 shows an arrangement example of the line pattern.

In the case where W plugs 10 are regularly arranged, for example, at a pitch of 80 nm in the lower layer, a line pattern 11 is formed in the resist as follows. That is, the line pattern 11 is divided, for example, by a length of 4 μm. By taking a pitch between the W plugs 10 as a period, the respective divided line patterns 11a are arranged, for example, while being shifted by 20 nm. The reason why the divided line patterns 11a are thus arranged while being shifted by bits is to average changes of the backward scattering intensity due to a displacement relative to the W plugs 10 in the lower layer during exposure.

After creating the exposure pattern data under conditions as described in the items (i), (ii) and (iii), the reflection coefficient $R_0$ and diffusion length $\sigma_0$ in the Si substrate (the zeroth layer (n=0)) are extracted.

In this case, firstly, the resist formed on the Si substrate as n=0 is subjected to exposure through the L/S pattern according to the exposure pattern data created in step S10 (steps S11 and S12). The optimum exposure amount $Q_{0,k}$ to the line pattern having the L/S pattern center is calculated for each L/S pattern (step S13). On this occasion, it is desired that in order to cancel an influence of a displacement relative to a pattern of the lower layer, an average of the optimum exposure amounts $Q_{0,k}$ in plural points near the L/S pattern center is calculated. Further, the thus obtained optimum exposure amount $Q_{0,k}$ is converted into the backward scattering intensity $F_{0,k}$ using the following formula (2) (step S14).

$$F_{0,k} = \frac{E_{th}}{Q_{0,k}} - \frac{1}{2} \quad (2)$$

In the formula (2), $E_{th}$ represents stored energy at a resolution level and can be obtained as $E_{th} = Q_{0,1}/2$ from the optimum exposure amount $Q_{0,1}$ to an isolated line (k=1).

Using the thus obtained backward scattering intensity $F_{0,k}$, the reflection coefficient $R_0$ and diffusion length $\sigma_0$ of the Si substrate are extracted. For this purpose, a rate of electrons which enter the Si substrate and then return to the resist must be calculated. The rate of electrons which enter one point of the resist and are reflected from the Si substrate to return to the resist is represented by the following formula (3) in which the backward scattering intensity is approximated using a Gaussian distribution.

$$R_0 \times \frac{1}{\pi \sigma_0^2} \exp\left(-\frac{x^2 + y^2}{\sigma_0^2}\right) \quad (3)$$

Accordingly, a rate $g_0(x)$ of electrons which enter one line pattern of the L/S pattern formed in the resist and are reflected to the L/S pattern center can be represented as in the following formula (4) by subjecting the formula (3) to surface integral on the line pattern.

$$g_0(x) = R_0 \times f(x, \sigma_0^2) = R_0 \times \frac{1}{2}\left[\text{erf}\left(\frac{w-2x}{2\sigma_0}\right) + \text{erf}\left(\frac{w+2x}{2\sigma_0}\right)\right] \quad (4)$$

In the formula (4), w represents a line pattern width and x represents a distance from a line pattern to the L/S pattern center. The formula (4) is applied to all the line patterns contained in the L/S pattern to obtain the rates for the respective line patterns. Then, the respective resultant rates are added as shown in the following formula (5). As a result, the backward scattering intensity $F_0(k)$ in the L/S pattern center of the L/S pattern is obtained (step S15).

$$F_0(k) = g_0(0) + 2\sum_{i=1}^{k/2} g_0(iP) \quad (5)$$

In the formula (5), P represents a pitch of the L/S pattern. This calculation is performed for each L/S pattern in the same manner.

Further, by applying the least-squares method to experimental values, that is, the backward scattering intensities $F_{0,k}$ in the number corresponding to the number of the L/S patterns changed in the number of the lines k and to calculated values, that is, the backward scattering intensities $F_0(k)$ of the formula (5) in the number corresponding to the number of the L/S patterns changed in the number of the lines k, the reflection coefficient $R_0$ and diffusion length $\sigma_0$ of the Si substrate are extracted (step S16).

Next, the reflection coefficient $R_{A,1}$, transmission coefficient $T_{A,1}$ and diffusion length $\sigma_{A,1}$ of the W plug in the first layer (n=1) formed on the Si substrate as well as the reflection coefficient $R_{B,1}$, transmission coefficient $T_{B,1}$ and diffusion length $\sigma_{B,1}$ of the insulating film in the first layer (n=1) formed on the Si substrate are separately extracted.

In this case, firstly, the first layer is formed on the Si substrate (steps S17, S18 and S19). On this occasion, the first layer is formed by changing a share $\alpha_w$ of the W plug into several types. Further, the exposure pattern data used when forming a resist on the first layer to subject the resist to exposure through the L/S pattern are previously subjected to proximity effect correction using the reflection coefficient $R_0$ and diffusion length $\sigma_0$ of the Si substrate extracted using the exposure pattern data created in step S10 (step S20). As a result, the W plug can be prevented from getting fat due to the proximity effect, so that the parameter extraction can be performed more accurately.

Further, in the same manner as in the Si substrate, the resist formed on the first layer on the Si substrate is subjected to exposure through the L/S pattern according to the exposure pattern data (step S12). The optimum exposure amount $Q_{1,k}$ to the line pattern having the L/S pattern center is calculated for each L/S pattern and for each share $\alpha_w$ of the W plug (step S13). Then, the amount $Q_{1,k}$ is converted into the backward scattering intensity $F_{1,k}$ (step S14).

Next, using the thus obtained backward scattering intensity $F_{1,k}$, the reflection coefficient $R_{A,1}$, transmission coefficient $T_{A,1}$ and diffusion length $\sigma_{A,1}$ of the W plug in the first layer as well as the reflection coefficient $R_{B,1}$, transmission coefficient $T_{B,1}$ and diffusion length $\sigma_{B,1}$ of the insulating film in the first layer are separately extracted. In this case, a rate $g_1(x)$ of electrons which enter one line pattern of the L/S pattern formed in the resist and are reflected to the L/S pattern center can be represented as in the following formula (6).

$$g_1(x) = R_{A,1}\alpha_W f(x, \sigma_{A,1}^2) + \tag{6}$$
$$R_{B,1}(1 - \alpha_W) f(x, \sigma_{B,1}^2) +$$
$$(T_{A,1}\alpha_W)^2 R_0 f(x, 2\sigma_{A,1}^2 + \sigma_0^2) +$$
$$2T_{A,1}\alpha_W T_{B,1}(1 - \alpha_W) R_0 f(x, \sigma_{A,1}^2 + \sigma_{B,1}^2 + \sigma_0^2) +$$
$$(T_{B,1}(1 - \alpha_W))^2 R_0 f(x, 2\sigma_{B,1}^2 + \sigma_0^2)$$

Respective terms of a right-hand side of the formula (6) are a Gaussian distribution for representing a rate of reflected electrons according to a scattering route of electrons. The first term is a rate of electrons reflected from the W plug in the first layer. The second term is a rate of electrons reflected from the insulating film in the first layer. The third term is a rate of electrons transmitted through the W plug in the first layer and then reflected from the zeroth layer to be transmitted again through the W plug in the first layer. The fourth term is a rate between electrons transmitted through the W plug in the first layer and then reflected from the zeroth layer to be transmitted through the insulating film in the first layer, and electrons transmitted through the insulating film in the first layer and then reflected from the zeroth layer to be transmitted through the W plug in the first layer. The fifth term is a rate of electrons transmitted through the insulating film in the first layer and then reflected from the zeroth layer to be transmitted again through the insulating film in the first layer.

The formula (6) is applied to all the line patterns contained in the L/S pattern to obtain the rates for the respective line patterns. Then, the respective resultant rates are added in the same manner as in the formula (5). As a result, the backward scattering intensity $F_1(k)$ in the L/S pattern center of the L/S pattern can be calculated (step S15). This calculation is performed for each L/S pattern in the same manner. Further, by applying the least-squares method to the experimental values (backward scattering intensities $F_{1,k}$) and calculated values (backward scattering intensities $F_1(k)$) in the number corresponding to the number of the L/S patterns and corresponding to the number of the shares $\alpha_w$ of the W plug, the reflection coefficient $R_{A,1}$, transmission coefficient $T_{A,1}$ and diffusion length $\sigma_{A,1}$ of the W plug in the first layer as well as the reflection coefficient $R_{B,1}$, transmission coefficient $T_{B,1}$ and diffusion length $\sigma_{B,1}$ of the insulating film in the first layer are separately extracted (step S16).

Next, the reflection coefficient $R_{A,2}$, transmission coefficient $T_{A,2}$ and diffusion length $\sigma_{A,2}$ of the W plug in the second layer (n=2) formed on the first layer as well as the reflection coefficient $R_{B,2}$, transmission coefficient $T_{B,2}$ and diffusion length $\sigma_{B,2}$ of the insulating film in the second layer (n=2) formed on the first layer are separately extracted. The parameter extraction in the layers subsequent to the second layer can be performed in the same procedure as that in the first layer. Therefore, the parameter extraction in the Nth layer (uppermost layer) of the multitiered structure is described.

The parameter extraction in the Nth layer can be performed in the same procedure as that in the first layer. However, since numerous layers are formed under the Nth layer, a calculating formula equivalent to the formula (6) is extremely complicated. Accordingly, a recursive formula as represented in the following formula (7) is used.

$$h_n(x, \sigma^2) = R_{A,n}\alpha_{W,n} f(x, \sigma^2 + \sigma_{A,n}^2) + \tag{7}$$
$$R_{B,n}(1 - \alpha_{W,n}) f(x, \sigma^2 + \sigma_{B,n}^2) +$$
$$(T_{A,n}\alpha_{W,n})^2 h_{n-1}(x, \sigma^2 + 2\sigma_{A,n}^2) +$$
$$2(T_{A,n}\alpha_{W,n})(T_{B,n}(1 - \alpha_{W,n})) h_{n-1}$$
$$(x, \sigma^2 + \sigma_{A,n}^2 + \sigma_{B,n}^2) + (T_{B,n}(1 - \alpha_{W,n}))^2$$
$$h_{n-1}(x, \sigma^2 + 2\sigma_{B,n}^2)$$

$$h_0(x, \sigma^2) = R_0 f(x, \sigma^2 + \sigma_0^2)$$

In the formula (7), the total diffusion length in the layers higher than an (n+1)th layer is represented by a. The formula (7) is composed of a part for calculating a rate of electrons reflected from the nth layer and a part for recursively calculating a rate of electrons reflected from the layers lower than an (n−1)th layer to the nth layer. Accordingly, when using the formula (7), a formula in the Nth layer, which is equivalent to the formula (6), is represented as in the following formula (8).

$$g_N(x) = h_N(x, 0) \tag{8}$$

Using the formula (8), the reflection coefficient $R_{A,N}$, transmission coefficient $T_{A,N}$ and diffusion length $\sigma_{A,N}$ of the W plug in the Nth layer as well as the reflection coefficient $R_{B,N}$, transmission coefficient $T_{B,N}$ and diffusion length $\sigma_{B,N}$ of the insulating film in the Nth layer may be separately extracted by applying the least-squares method to the experimental values (backward scattering intensities $F_{1,k}$) and calculated values (backward scattering intensities $F_1(k)$) in the number corresponding to the number of the L/S patterns and corresponding to the number of the shares $\alpha_w$ of the W plug in the same procedure as in the first layer.

In step S19, the Nth layer is formed on a lower layer structure composed of the layers from the zeroth layer to the (N−1)th layer. When forming the Nth layer, the parameter of the Si substrate as the zeroth layer and the parameter of each construction material of each layer from the first layer to the (N−1)th layer are already extracted. Therefore, when forming the multitiered structure, each layer from the first layer to the (N−1)th layer can be constituted using the insulating film.

Thus, the reflection coefficient R, transmission coefficient T and diffusion length σ of each layer can be extracted sequentially from the zeroth layer to the Nth layer. On this occasion, when extracting a parameter of the nth layer of which the parameter is unknown, the parameters of the layers lower than the nth layer (from the zeroth layer to the (n−1)th layer) are known. Therefore, in the parameter extraction, a share of the construction material may be changed only in the nth layer. As a result, layer combinations to be considered or the number of experimental data can be drastically reduced. Thus, according to the parameter extracting method, the parameter of the multitiered structure having various layer combinations can be extracted accurately and effectively. Further, by using the thus extracted parameter, also when the multitiered structure is formed under the resist, the backward scattering intensity can be calculated accurately. As a result, correct proximity effect correction can be performed.

Figure 7:
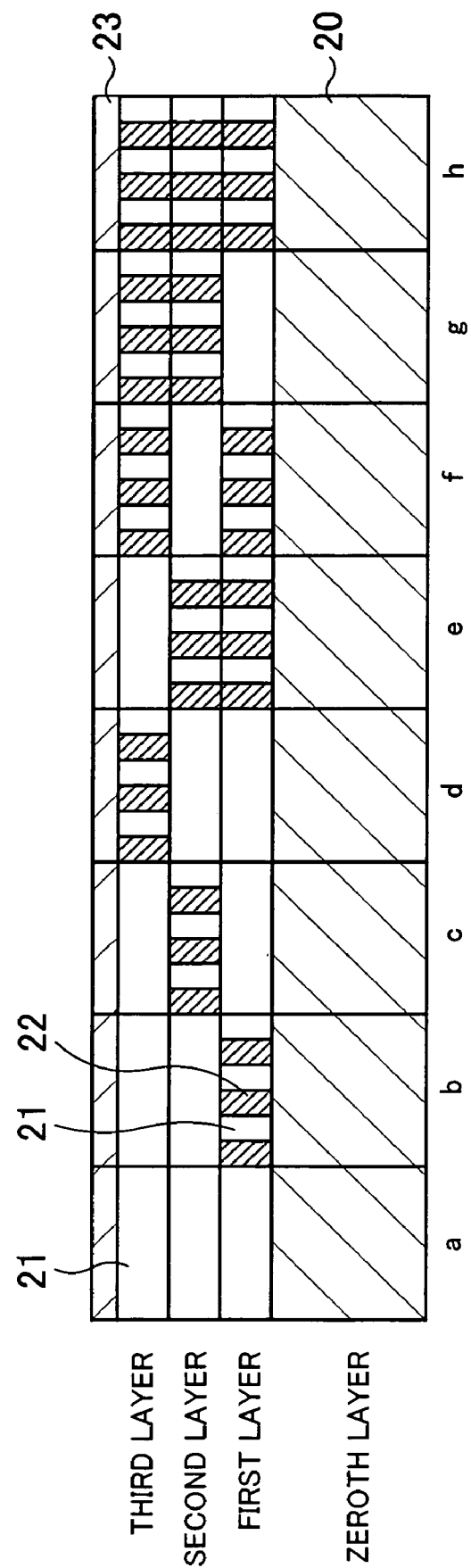
FIG. 7 shows one example of combinations of layers in a multitiered structure.
Figure 8:
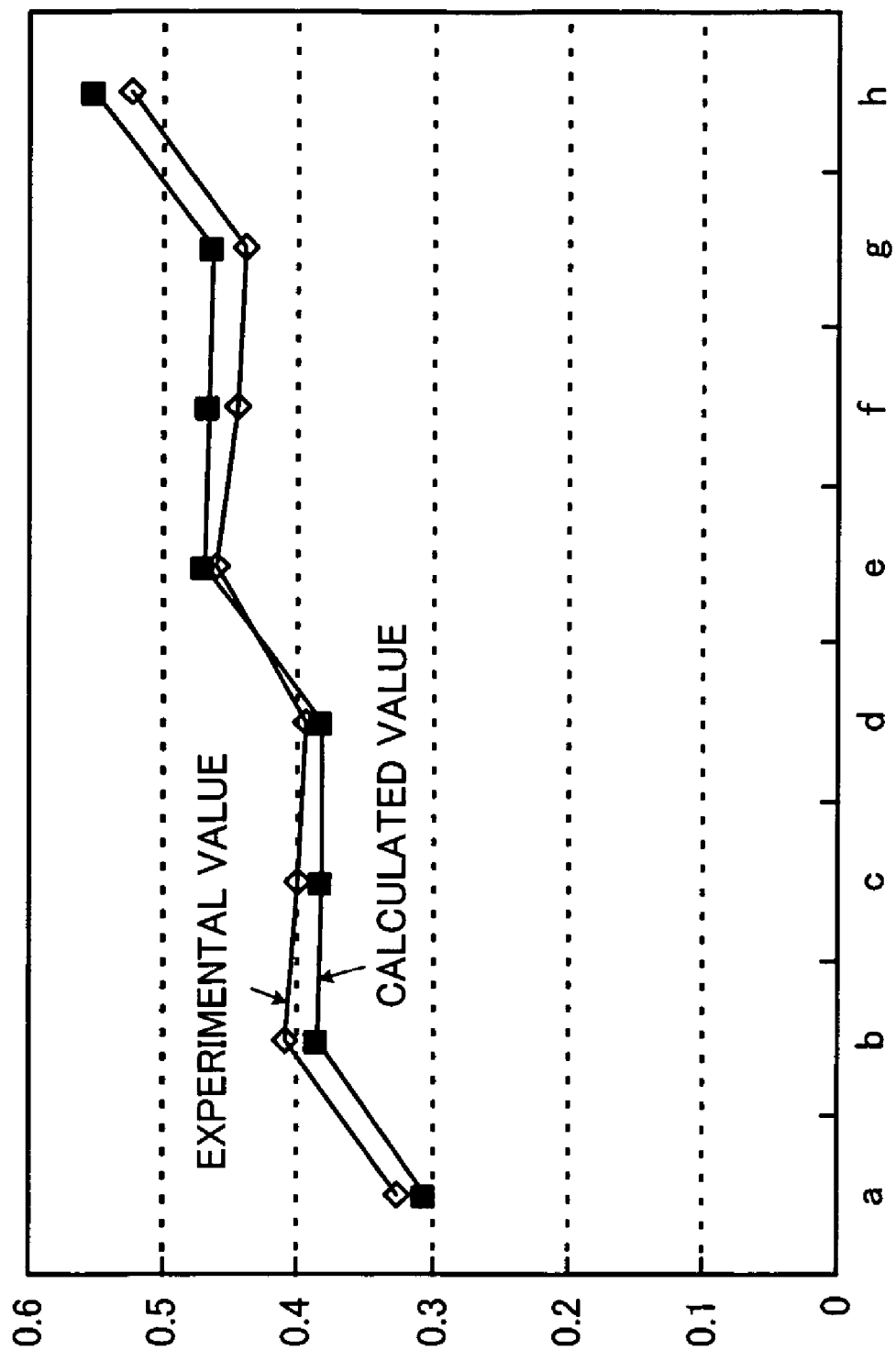
FIG. 8 shows a relation between a combination of layers in a multitiered structure and a backward scattering intensity (part 1).
Figure 9:
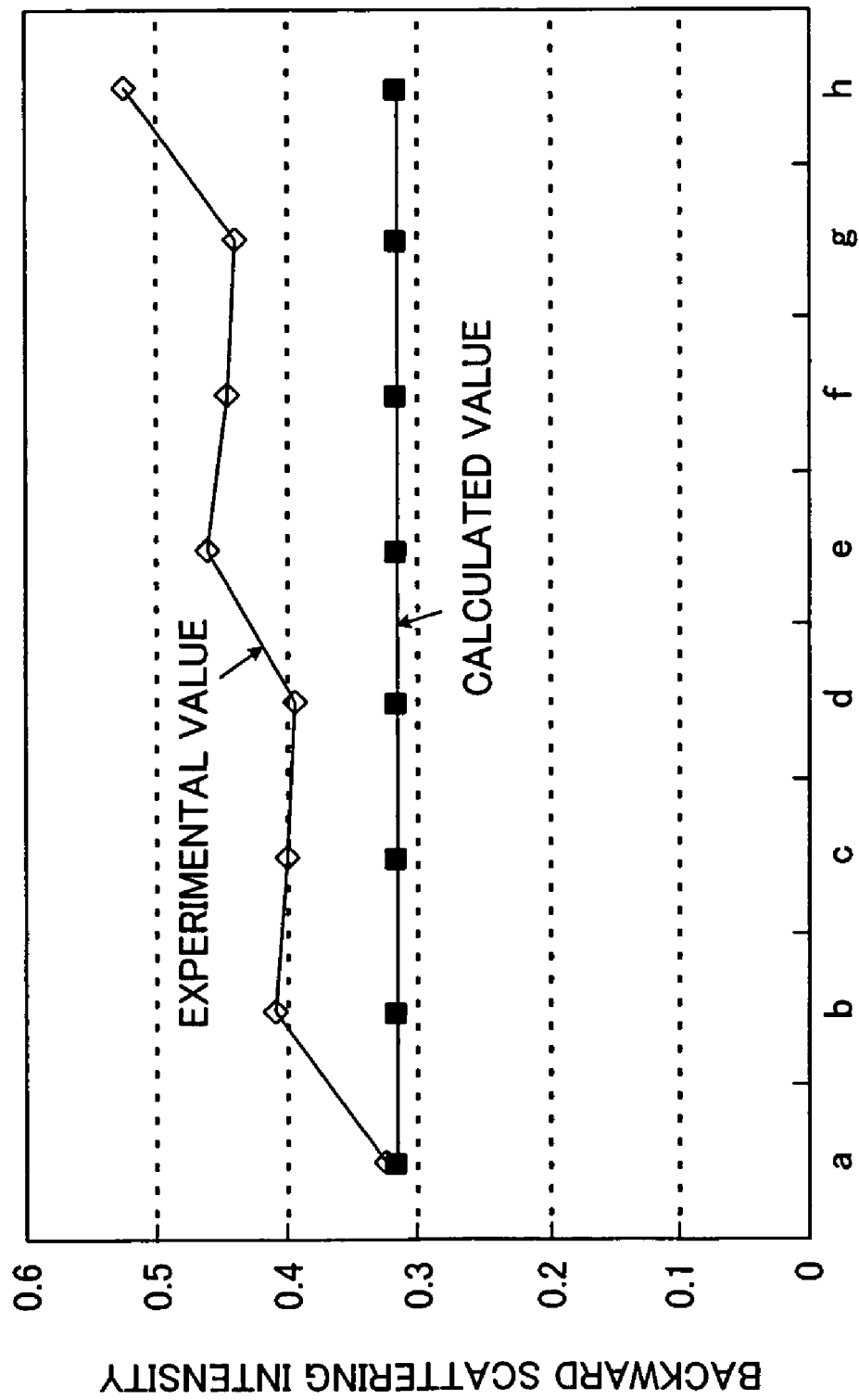
FIG. 9 shows a relation between a combination of layers in a multitiered structure and a backward scattering intensity (part 2).

Herein, FIG. 7 shows one example of the combinations of layers in the multitiered structure. FIGS. 8 and 9 each show a relation between the combination of layers in the multitiered structure and the backward scattering intensity. FIG. 8 shows the relation therebetween in the case of using the parameter extracting method described above, that is, in the case of considering the proximity effect in the multitiered structure. FIG. 9 shows the relation therebetween in the case of using no parameter extracting method described above, that is, in the case of excluding the proximity effect in the multitiered structure.

As shown in FIG. 7, for example, a layer composed of a $SiO_2$ film 21 and a layer composed of the $SiO_2$ film 21 and a W plug 22 are laminated in an appropriate order to configure a three-layer structure on a Si substrate 20. Further, a resist 23 is formed on the three-layer structure. Herein, assume a case where the L/S pattern having a ratio of 1:1.25 is formed in the resist 23.

In the three-layer structure, the following eight combinations in total are considered. More specifically, there are considered a case where all the three layers are layers composed of the $SiO_2$ film 21 (a), a case where only one layer among three layers is a layer composed of the $SiO_2$ film 21 and the W plug 22, and the layer is inserted into each of a first, second or third layer (b, c and d), a case where two layers among three layers are layers composed of the $SiO_2$ film 21 and the W plug 22, and the layers are inserted into each of first and second layers, first and third layers, or second and third layers (e, f and g), and a case where all the three layers are layers composed of the $SiO_2$ film 21 and the W plug 22 (h).

With respect to the three-layer structures as described above, comparison is made between the experimentally obtained backward scattering intensity (experimental value) and the backward scattering intensity (calculated value) computationally obtained using the respective parameters obtained by the above-described parameter extracting method. As shown in FIG. 8, it is understood that both the values show very preferable approximation. On the contrary, all the backward scattering intensities approximated using a formula excluding the proximity effect in the multitiered structure, that is, using the formula (1) are the same value irrespective of the layer structure, as shown in FIG. 9. Particularly, as the layer having the W plug 22 more increases in number, the actual backward scattering intensity more increases. Therefore, a disjunction between the experimental value and the calculated value increases in such a layer structure. In the above-described parameter extracting method, the extraction of parameters can be performed excluding the combination of layers. Further, the experimental values and the calculated values show a preferable approximation in all the combinations of (a) to (h).

Herein, the parameter of each layer is extracted sequentially from the lower layers. When all the film thicknesses and construction materials of the respective layers from the first layer to a layer just under a parameter extracting objective layer (unknown parameter layer) are the same, the parameter extracted in the first layer may be directly applied to the respective layers from the first layer to the layer just under the parameter extracting objective layer.

Herein, description is made by taking, by way of example, a case of forming the L/S pattern in the resist to perform the parameter extraction. Further, also when forming the hole pattern or the doughnut pattern to perform the parameter extraction, the same procedure may be taken.

For example, when forming the hole pattern to perform the parameter extraction, procedures from step S1 to step S14 shown in FIG. 5 are the same as those in the L/S pattern. Further, when using the hole pattern, the parameter extraction can be performed by changing the formulae (4) and (5) used in subsequent step S15.

Figure 10:
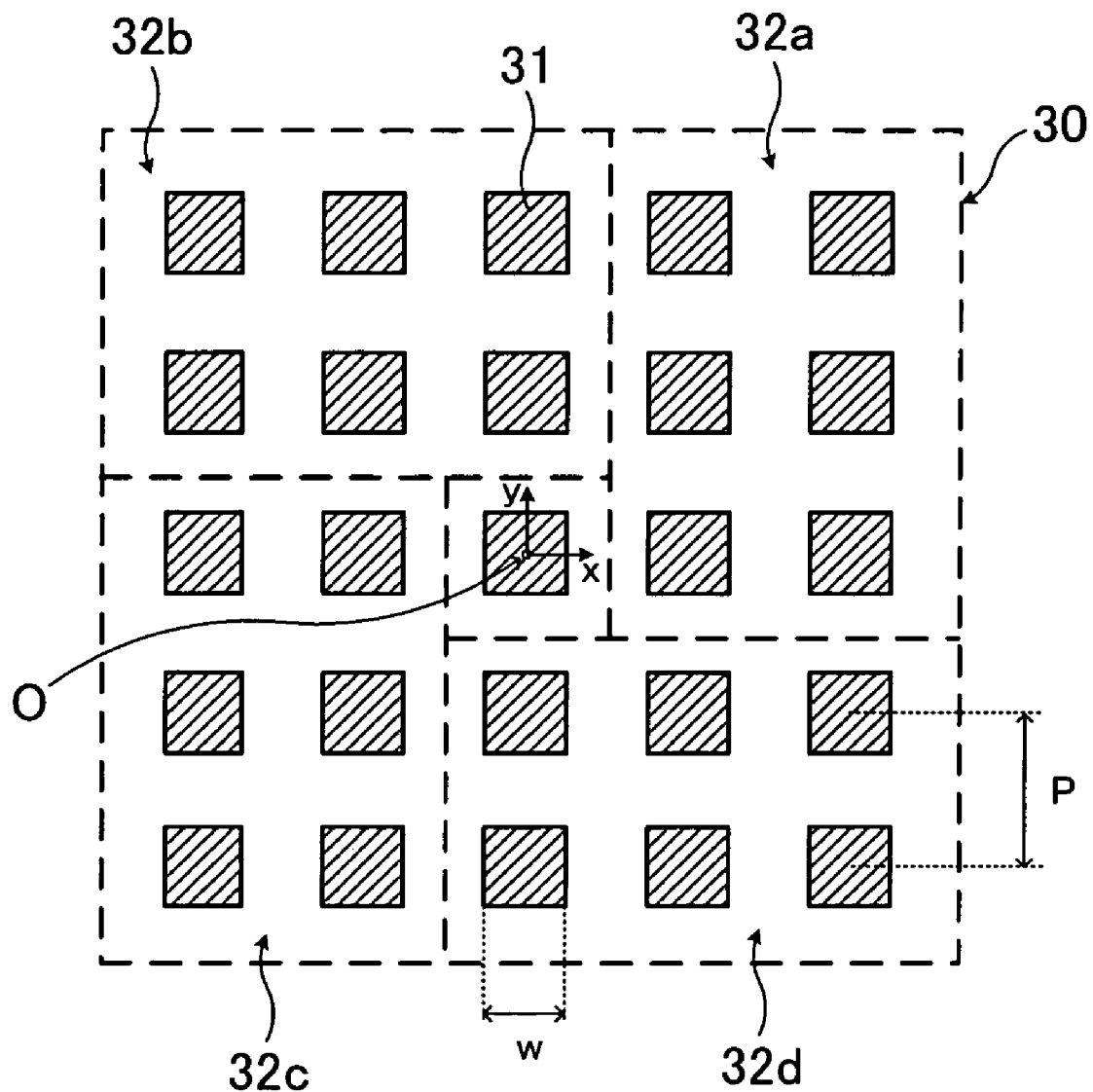
FIG. 10 illustrates a calculation method of a backward scattering intensity in a case of using a hole pattern in parameter extraction.

FIG. 10 illustrates a calculation method of the backward scattering intensity in a case of using the hole pattern in the parameter extraction.

A rate of electrons which enter one hole pattern 31 and are reflected to the center O of the hole pattern region 30 can be represented as in the following formula (4A) by subjecting the formula (3) to surface integral on the hole pattern 31.

$$g_0(x, y) = R_0 \times f(x, y, \sigma_0^2) \qquad (4A)$$
$$= R_0 \times \frac{1}{4}\left[\mathrm{erf}\left(\frac{w-2x}{2\sigma_0}\right) + \mathrm{erf}\left(\frac{w+2x}{2\sigma_0}\right)\right]$$
$$\left[\mathrm{erf}\left(\frac{w-2y}{2\sigma_0}\right) + \mathrm{erf}\left(\frac{w+2y}{2\sigma_0}\right)\right]$$

In the formula (4A), w represents a width of the hole pattern 31, and x and y represent center coordinates of the hole pattern 31 in the coordinate system having as the origin the center O of the hole pattern region 30. The formula (4A) is applied to all the hole patterns 31 contained within the hole pattern region 30 to obtain the rates for the patterns 31. Then, the respective resultant rates are added as shown in the following formula (5A). As a result, the backward scattering intensity $F_0(k)$ in the center O of the hole pattern region 30 is obtained.

$$F_0(k) = g_0(0, 0) + 4\sum_{i=1}^{k/2}\sum_{j=0}^{k/2} g_0(iP, jP) \qquad (5A)$$

In the formula (5A), k represents the number of arrangements in one direction of the hole pattern 31, and P represents an arranging pitch in one direction of the hole pattern 31. Herein, it is specified that both the number of arrangements k and the arranging pitch P are the same in the x direction and in the y direction. The first term of the right-hand side of the formula (5A) represents the backward scattering intensity in the center O obtained from the hole pattern 31 in the central portion of the hole pattern region 30. The second term thereof represents the backward scattering intensity in the center O obtained from the hole patterns 31 other than that in the central portion. The intensity in the second term is calculated as follows. That is, the hole patterns 31 other than that in the central portion are divided into four similar-size hole pattern groups 32a, 32b, 32c and 32d in the upper right portion, upper left portion, lower left portion and lower right portion of FIG. 10, respectively. Further, the sum of the backward scattering intensities in the center O obtained from the respective hole patterns 31 within the hole pattern group 32a in the upper right portion is determined. Then, the sum is quadrupled.

In the subsequent step S16, the reflection coefficient $R_0$ and diffusion length $\sigma_0$ of the Si substrate are extracted by applying the least-squares method to the experimental value (backward scattering intensity $F_{0, k}$) and to the calculated value (backward scattering intensity $F_0(k)$) obtained using the formulae (4A) and (5A). Also in the steps subsequent to step S17, in the same manner as in the L/S pattern, the parameter extraction of the upper layer may be performed using the formulae (4A) and (5A), if necessary.

Further, also when forming the doughnut pattern to perform the parameter extraction, the parameter extraction can be performed by changing the formulae (4) and (5) used in step S15 in the case of the L/S pattern.

Figure 11:
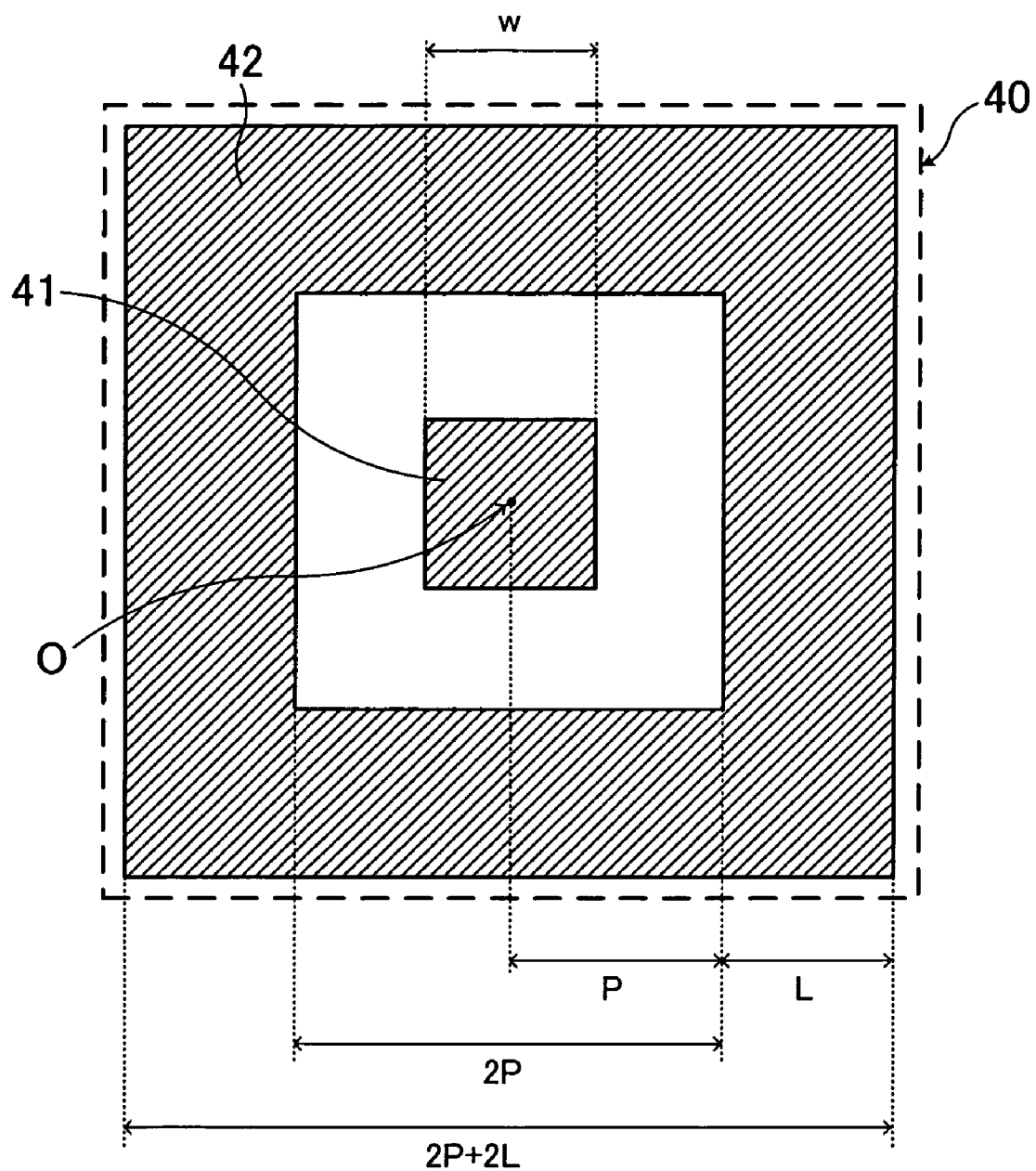
FIG. 11 illustrates a calculation method of a backward scattering intensity in a case of using a doughnut pattern in parameter extraction.

FIG. 11 illustrates a calculation method of the backward scattering intensity in the case of using the doughnut pattern in the parameter extraction.

In a doughnut pattern region 40 of FIG. 11, a square pattern 41 is arranged in a central portion of the region. Further, a doughnut pattern 42 surrounding the pattern 41 is formed around the pattern 41. In the case of FIG. 11, it can be considered that the doughnut pattern 42 is configured by combining two square patterns having a different size from each other.

Herein, a rate of electrons which enter the square pattern 41 in the central portion and are reflected to the center O of the pattern 41 can be represented as in the following formula (4B) by subjecting the formula (3) to surface integral on the hole pattern 41.

$$g_0(w) = R_0 \times f(w, \sigma_0^2) = R_0 \times \left[\text{erf}\left(\frac{w}{2\sigma_0}\right)\right]^2 \quad (4B)$$

In the formula (4B), w represents a width of the square pattern 41. The formula (4B) has the same form as that in the case of using x=y=0 in the formula (4A).

However, as described below, the backward scattering intensity in the center O obtained from the doughnut pattern 42 surrounding the square pattern 41 in the central portion of the doughnut pattern region 40 is herein calculated in the same manner as in the above case. Therefore, w is treated as a variable.

As well as to the square pattern 41 in the central portion, the formula (4B) is applied to the doughnut pattern 42 around the pattern 41 to obtain the rate for the pattern 42. Then, the respective resultant rates are added as shown in the following formula (5B). As a result, the backward scattering intensity $F_0(L)$ in the center O of the doughnut pattern region 40 can be obtained.

$$F_0(L) = g_0(w) + [g_0(2P+2L) - g_0(2P)] \quad (5B)$$

In the formula (5B), P represents a distance from the center O to the inner frame of the doughnut pattern 42 and L represents a width (thickness) of the doughnut pattern 42. Herein, w and P are treated as fixed values. The first term of the right-hand side of the formula (5B) represents the backward scattering intensity in the center O obtained from the square pattern 41 in the central portion. The second term thereof represents the backward scattering intensity in the center O obtained from the doughnut pattern 42. However, the backward scattering intensity in the center O obtained from the doughnut pattern 42 is calculated by subtracting the backward scattering intensity in the center O obtained from the square pattern in an inner-frame size of the doughnut pattern 42 from the backward scattering intensity in the center O obtained from the square pattern in an outer-frame size of the pattern 42.

In step S16, the reflection coefficient $R_0$ and diffusion length $\sigma_0$ of the Si substrate are extracted by applying the least-squares method to the experimental value (backward scattering intensity $F_{0, L}$) and to the calculated value (backward scattering intensity $F_0(L)$) obtained using the formulae (4B) and (5B). Also in the steps subsequent to step S17, in the same manner as in the L/S pattern, the parameter extraction of the upper layer may be performed using the formulae (4B) and (5B), if necessary.

As described above, the parameter extraction method according to the first embodiment is performed as follows. When the multitiered structure is formed under the resist, a layer to be subjected to the parameter extraction (unknown parameter layer) is first formed on a parameter-extracted layer (known parameter layer) by changing a share of the construction material. Further, the resist is formed on the unknown parameter layer. Then, the resist is subjected to exposure through a pattern changed in the existing range. From the exposure result, parameters of the unknown parameter layer, that is, a reflection coefficient R, a transmission coefficient T and a diffusion length $\sigma$ are extracted. After thus extracting the parameters of the unknown parameter layer, the layer is treated as the known parameter layer. Further, on the known parameter layer, an unknown parameter layer is newly formed. Then, the parameter of the unknown parameter layer is extracted in the same manner.

Thus, in the parameter extracting method according to the first embodiment, the parameters are extracted sequentially from the lower layers of the multitiered structure. Therefore, a multitiered structure in which only the unknown parameter layer is changed in the share of the construction material may be used. As a result, only by extracting parameters using the multitiered structure and performing the proximity effect correction using the extracted parameters, the correction for various multitiered structures can be performed accurately and effectively.

Next, the second embodiment will be described.

Figure 12:
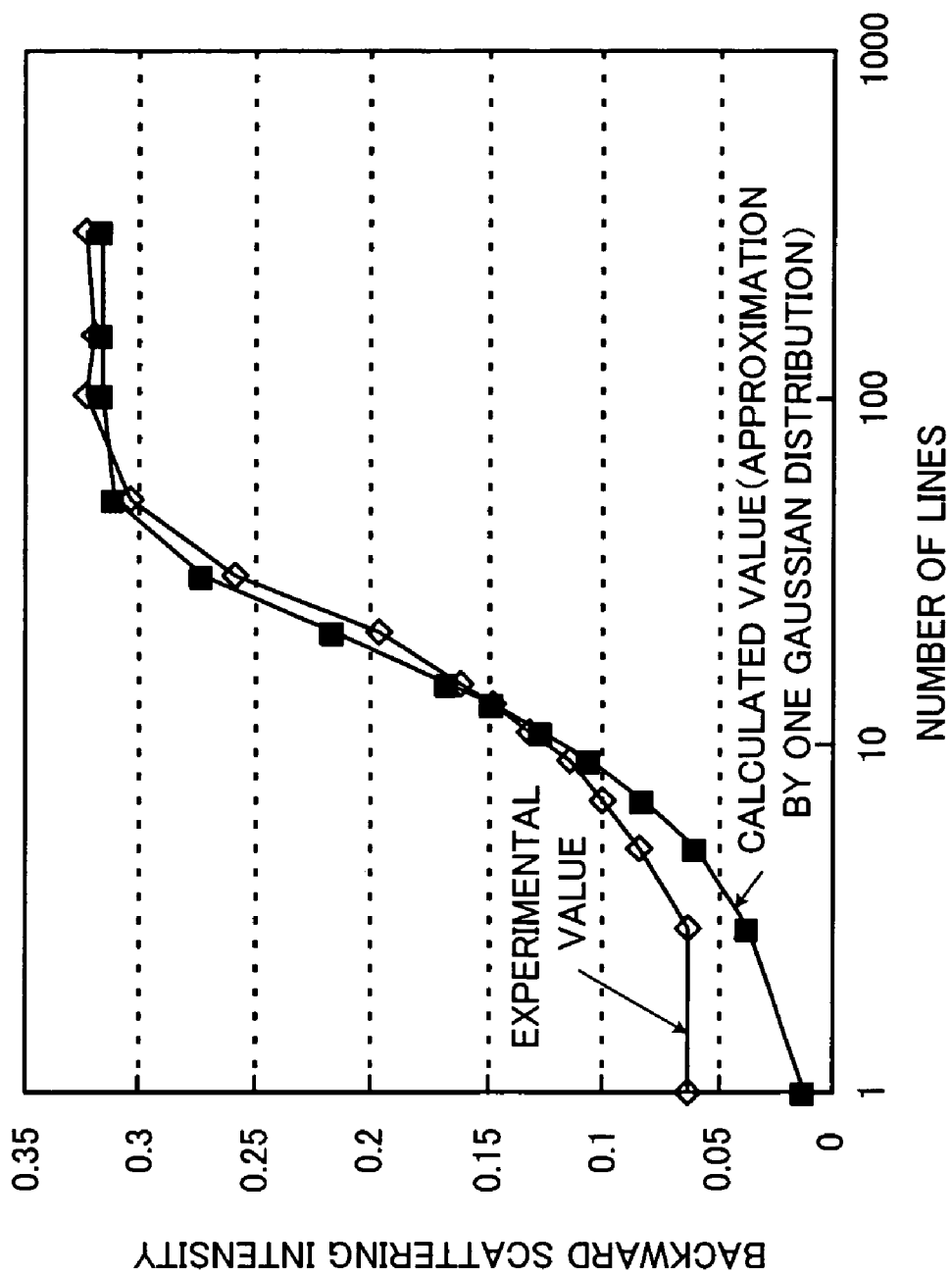
FIG. 12 shows a relation between the number of lines in a L/S pattern formed on a Si substrate and a backward scattering intensity.

FIG. 12 shows a relation between the number of lines in the L/S pattern formed on the Si substrate and the backward scattering intensity.

In the relation between the number of lines in the L/S pattern formed in the resist on the Si substrate and the backward scattering intensity in the L/S pattern center, the following fact is found. That is, when the number of lines in the L/S pattern is large, a relatively high match is found between the experimentally obtained backward scattering intensity and the conventional backward scattering intensity approximated using one Gaussian distribution. However, when the number of lines is small, a difference in the backward scattering intensities increases. In the second embodiment, the Si substrate is virtually divided and considered to be a multi-layer. Further, the backward scattering intensity is approximated using a multi-Gaussian distribution to perform the parameter extraction.

In the following description, reflection coefficients and diffusion lengths in the zeroth layers of the Si substrates before and after the division are represented by $R_0$ and $\sigma_0$, respectively. A reflection coefficient, transmission coefficient and diffusion length in the nth layer of the Si substrate after the division are represented by $R_n$, $T_n$ and $\sigma_n$, respectively. The backward scattering intensity experimentally obtained and backward scattering intensity computationally obtained when dividing the substrate into the number of layers n+1 are represented by $F_{n,\,k}$ and $F_n(k)$, respectively (provided that k is the number of lines in the L/S pattern). A rate of electrons which enter one line pattern of the L/S pattern formed in the resist when dividing the substrate into the number of layers n+1 and are reflected to the L/S pattern center is represented by $g_n(x)$ and $h_n(x, \sigma^2)$ (provided that x is a distance from one line pattern center to the L/S pattern center).

Figure 13:
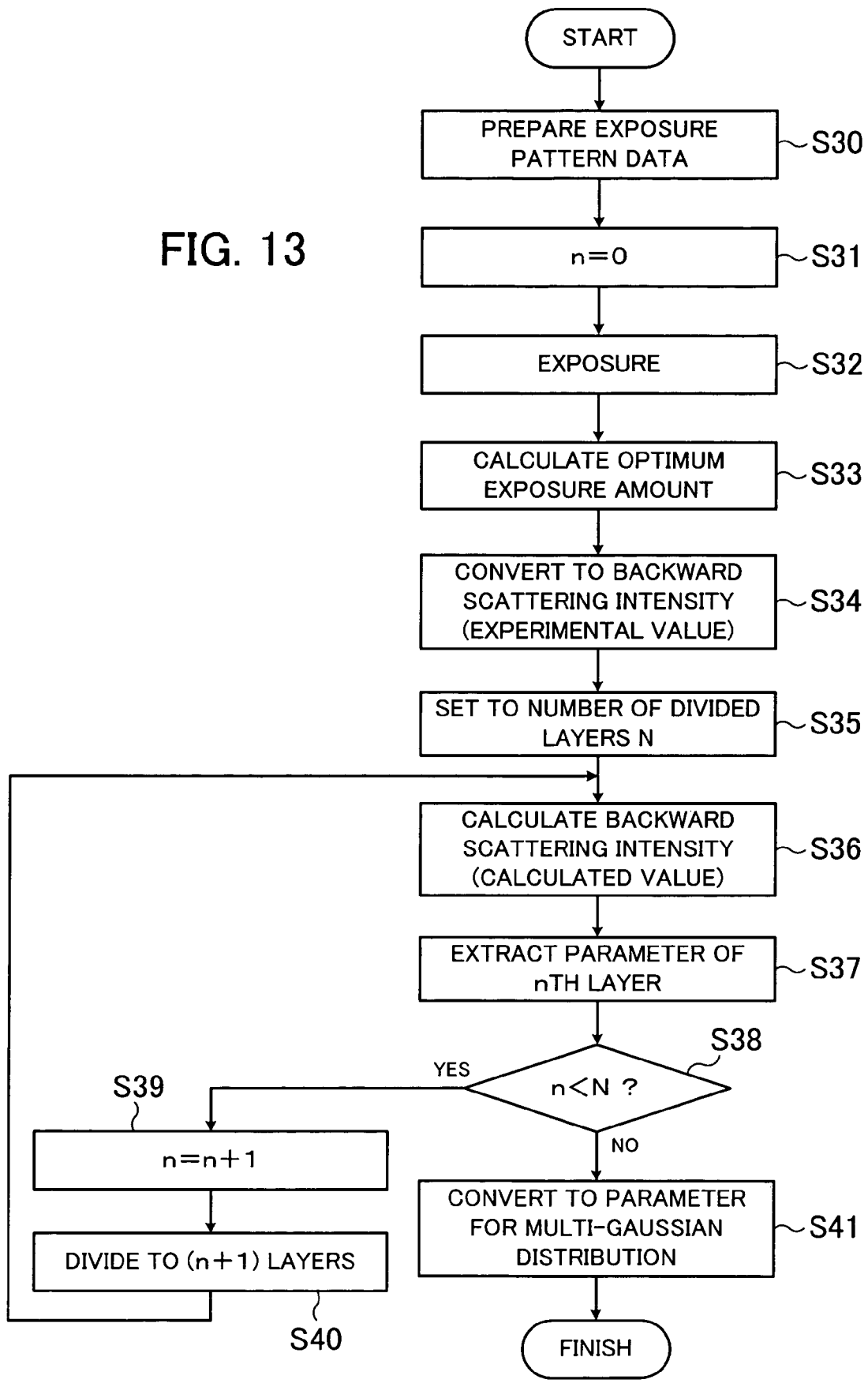
FIG. 13 shows a parameter extracting flow according to a second embodiment.

FIG. 13 shows a parameter extracting flow according to the second embodiment.

In the parameter extraction according to the second embodiment, the exposure pattern data used for forming the pattern in a resist are first created (step S30). When a pattern to be formed is, for example, the L/S pattern, the exposure pattern data are created under conditions as shown in the following (i) and (ii).

(i) The L/S pattern is configured by being changed in the number of lines k from one to several hundreds. For example, each L/S pattern having 1, 3, 5, 7, 9, 11, 13, 15, 21, 31, 51, 101 or 301 line patterns is configured.

(ii) A line width and space width of the L/S pattern are set to about three to five times the forward scattering length $\beta_f$. For example, when an estimated maximum value of the forward scattering length $\beta_f$ is 80 nm, the line width and space width of the L/S pattern are set to from 240 to 400 nm.

Next, the resist formed on the Si substrate as the zeroth layer (n=0) at the present moment is subjected to exposure through the L/S pattern according to the exposure pattern data created in step S30 (steps S31 and S32). In the same manner as in the first embodiment, the optimum exposure amount $Q_{0,\,k}$ to the line pattern having the L/S pattern center is calculated for each L/S pattern (step S33). The thus obtained exposure amount $Q_{0,\,k}$ is converted into the backward scattering intensity $F_{0,\,k}$ (step S34).

Next, the number of virtually divided layers of the Si substrate is set from the number of Gaussian distributions used for an approximation (step S35). When performing the approximation using N Gaussian distributions, the number of the divided layers is set to N and the Si substrate is equally divided (N−1) times.

Next, in the same manner as in the first embodiment, the backward scattering intensity $F_0(k)$ is computationally obtained using the formulae (3), (4) and (5) (step S36). Then, the reflection coefficient $R_0$ and diffusion length $\sigma_0$ of the Si substrate are extracted by applying the least-squares method to the experimental value (backward scattering intensity $F_{0,\,k}$) and to the calculated value (backward scattering intensity $F_0(k)$) (step S37).

Next, the Si substrate is first divided virtually into two layers (steps S38, S39 and S40). A layer on the resist side is designated as a first layer (n=1), and the reflection coefficient $R_1$, transmission coefficient $T_1$ and diffusion length $\sigma_1$ of the first layer are separately extracted. A rate $g_1(x)$ of electrons which enter one line pattern of the L/S pattern formed in the resist and are reflected to the L/S pattern center can be represented as in the following formula (9).

$$g_1(x) = R_1 f(x, \sigma_1^2) + T_1^2 R_0 f(x, 2_1^2 + \sigma_0^2) \quad (9)$$

In the formula (9), the first term represents a rate of electrons reflected from the first layer and the second term represents a rate of electrons reflected from the zeroth layer. The formula (9) is applied to all the line patterns contained in the L/S pattern to obtain the rates for the respective line patterns.

Then, the respective resultant rates are added. As a result, the backward scattering intensity $F_1(k)$ in the L/S pattern center of the L/S pattern can be calculated (step S36). Further, the reflection coefficient $R_1$, transmission coefficient $T_1$ and diffusion length $\sigma_1$ of the first layer are separately extracted by applying the least-squares method to experimental values (backward scattering intensities $F_{0,\,k}$) and calculated values (backward scattering intensities $F_1(k)$) in the number corresponding to the number of the L/S patterns (step S37).

Also the parameter extraction in the layers subsequent to the second layer can be performed in the same procedure as that in the first layer. A formula in the Nth layer, which is equivalent to the formula (9), can be recursively represented as in the following formulae (10) and (11).

$$h_n(x, \sigma^2) = R_n f(x, \sigma^2 + \sigma_n^2) + T_n^2 h_{n-1}(x, \sigma^2 + 2\sigma_n^2)$$

$$h_0(x, \sigma^2) = R_0 f(x, \sigma^2 + \sigma_0^2) \quad (10)$$

$$g_N(x) = h_N(x, 0) \quad (11)$$

Thus, the reflection coefficient R, transmission coefficient T and diffusion length σ of each of the virtually divided layers can be extracted sequentially from the zeroth layer to the Nth layer.

Finally, the extracted reflection coefficient R, transmission coefficient T and diffusion length σ of each layer are converted into parameters for the multi-Gaussian distribution (step S41).

In this case, an EID function in which the backward scattering intensity distribution is shown by the multi-Gaussian distribution is represented by the following formula (12).

$$f(x, y) = \frac{1}{\pi\left(1 + \sum_{m=1}^{N} \eta_m\right)} \left(\frac{1}{\beta_f^2} \exp\left(-\frac{x^2 + y^2}{\beta_f^2}\right) + \sum_{m=1}^{N} \frac{\eta_m}{\beta_{b,m}^2} \exp\left(-\frac{x^2 + y^2}{\beta_{b,m}^2}\right)\right) \quad (12)$$

In the formula (12), the second term of the right-hand side represents the backward scattering intensity distribution. Based on this, the respective parameters of the backward scattering rate $\eta_m$ and backward scattering length $\beta_{b,\,m}$ (m=1 to N) contained in the second term can be made to correspond to each other as in the following formula (13) from the forms of the formulae (10) and (11).

$$\begin{cases} \eta_1 = R_{N-1}, & \beta_{b,1} = \sigma_{N-1} \\ \eta_2 = T_{N-1}^2 R_{N-2}, & \beta_{b,2} = \sqrt{2\sigma_{N-1}^2 + \sigma_{N-2}^2} \\ \vdots & \vdots \\ \eta_N = T_{N-1}^2 \cdots T_1^2 R_0, & \beta_{b,N} = \sqrt{2\sigma_{N-1}^2 + \cdots + 2\sigma_1^2 + \sigma_0^2} \end{cases} \quad (13)$$

Thus, the reflection coefficient R, transmission coefficient T and diffusion length σ of each layer are converted into parameters for the multi-Gaussian distribution.

Figure 14:
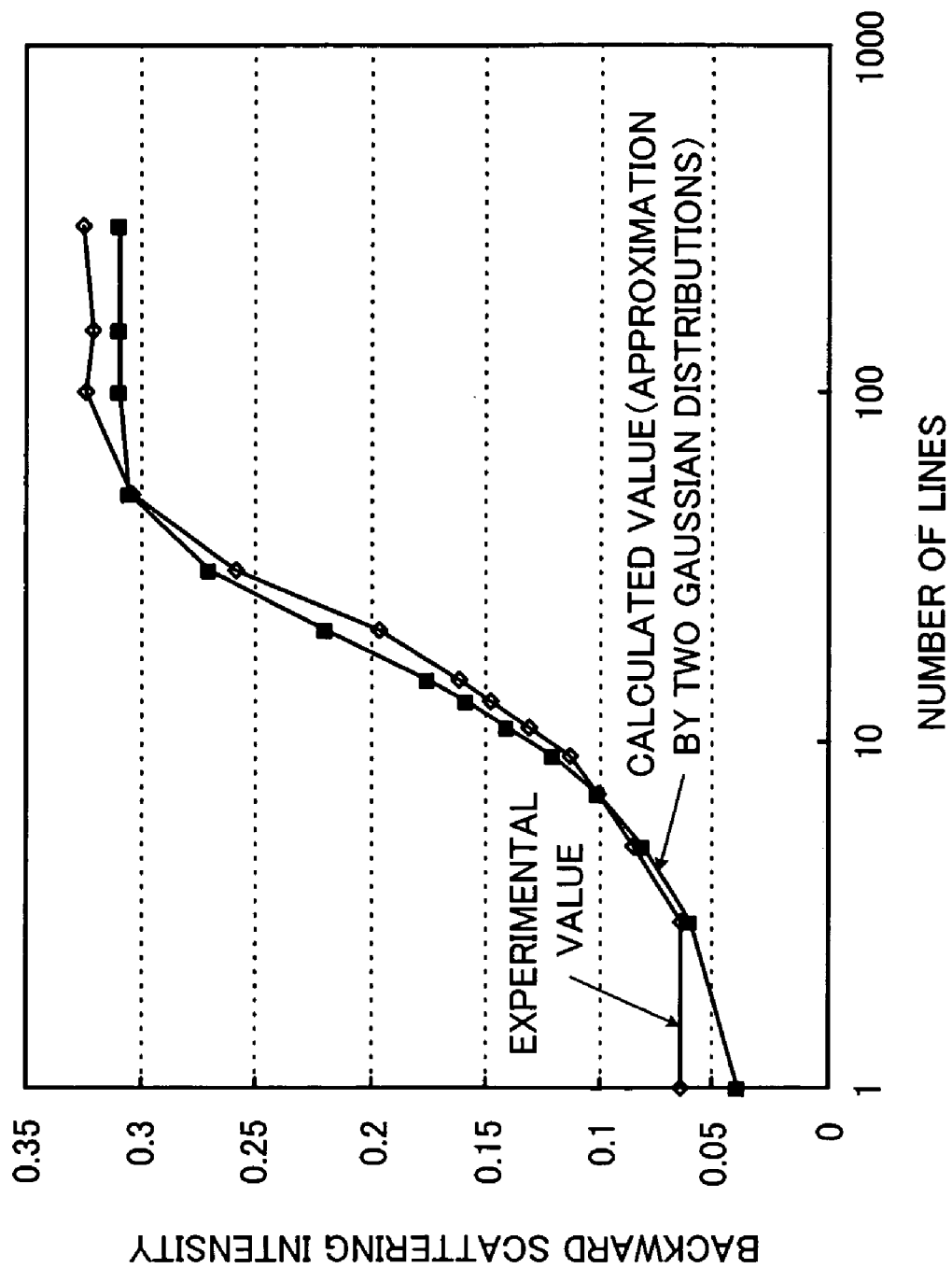
FIG. 14 shows a result obtained by approximating a backward scattering intensity using two Gaussian distributions.
Figure 15:
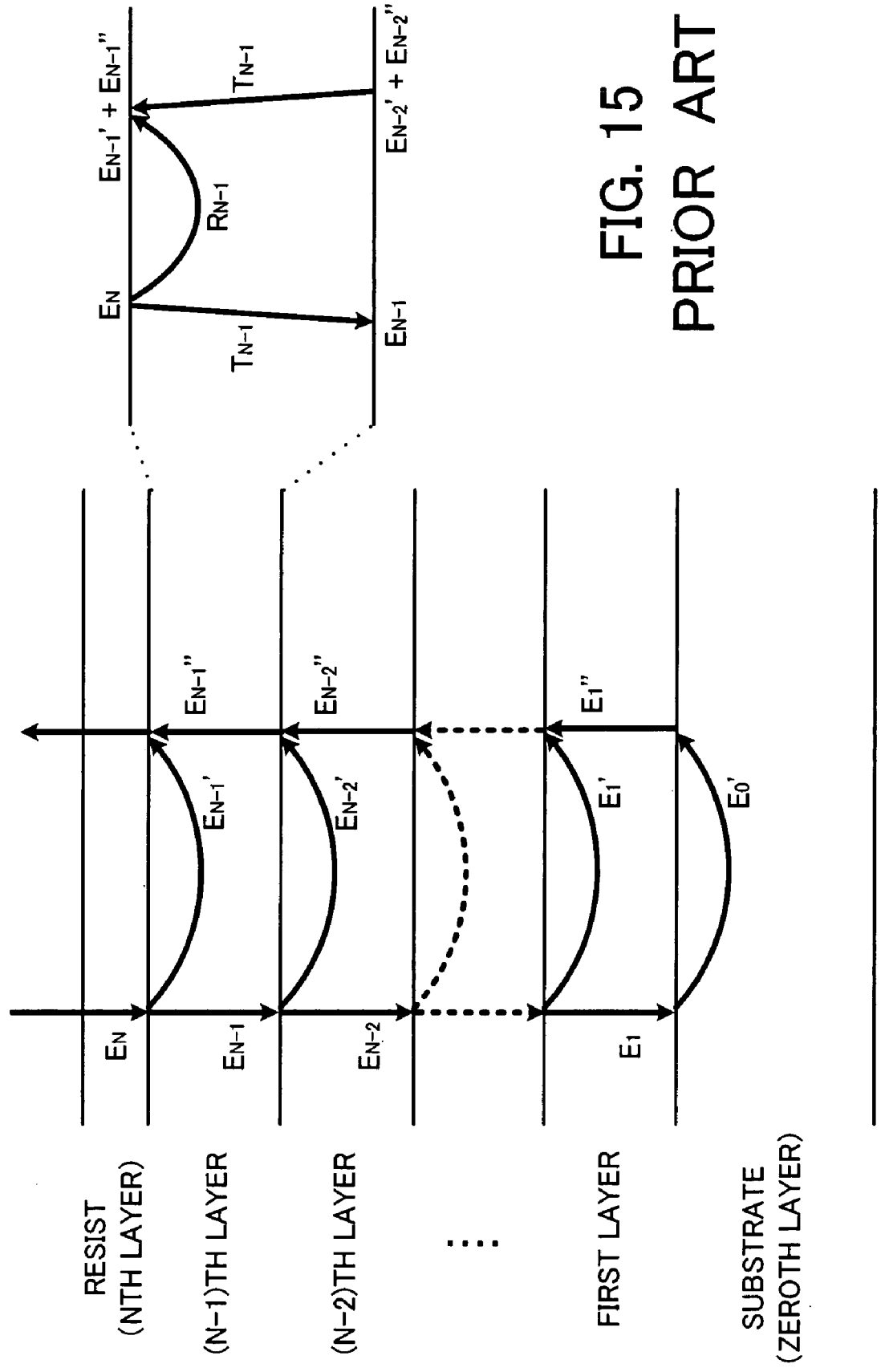
FIG. 15 illustrates a principle of a conventional calculation technique of a backward scattering intensity.

FIG. 14 shows a result obtained by approximating the backward scattering intensity using two Gaussian distributions.

Compared with the result of FIG. 12, it is understood that also when the number of lines in the L/S pattern is small, a relatively high match is found between the experimentally obtained backward scattering intensity and the backward scattering intensity approximated using two Gaussian distributions.

Also in the second embodiment, when performing the parameter extraction using the hole pattern or the doughnut pattern, the extraction can be performed in the same manner as in the first embodiment.

As described above, in the second embodiment, the Si substrate is virtually divided and the parameters of the respective layers are extracted sequentially from the lower layers. On this occasion, the uppermost layer is treated as an unknown parameter layer and the layer lower than the unknown parameter layer is treated as a known parameter layer to extract the parameter of the unknown parameter layer. Further, the number of the divided layers is increased. Then, the extracted parameters of the respective layers are converted into those for Gaussian distributions in the number corresponding to the number of the divided layers of the Si substrate. Thereafter, the backward scattering intensity is obtained by the Gaussian distribution (multi-Gaussian distribution) using the converted parameter. Accordingly, each Gaussian distribution is allowed to have a meaning that the backward scattering intensity is obtained using a rate of electrons reflected from each layer. Further, when calculating the backward scattering intensity, an effect on the result value caused by the existing range of patterns formed in the resist can be minimized. As a result, the proximity effect correction can be performed more accurately.

The above description is made by taking, by way of example, a case of applying the parameter extracting method to electron beam exposure. Further, the parameter extracting method is similarly applicable also to a case of performing exposure using an ion beam.

In the present invention, the unknown parameter layer is formed on the known parameter layer to extract parameters sequentially from the lower layers. As a result, the following advantages can be obtained. That is, in the multitiered structure, since the parameters of the layers lower than the unknown parameter layer are known, layer combinations to be considered can be drastically reduced so that the number of experimental data can be reduced. Further, since the parameters are extracted sequentially from the lower layers, electron scattering within the multitiered structure is reflected more truly so that the parameter of each layer can be obtained accurately.

Further, when extracting the parameter of the unknown parameter layer, since the parameters of the layers lower than the unknown parameter layer are known, the need to change the share of the construction material in each layer lower than the unknown parameter layer is eliminated when actually forming the multitiered structure. Therefore, according to the parameter extracting method of the present invention, the parameter of the multitiered structure having various layer combinations can be extracted accurately and effectively.

Further, in the present invention, one layer is virtually divided and then parameters of the respective layers are extracted from a lower layer side. As a result, electron scattering within a layer can be more reflected to extract a parameter and therefore, the parameter of the layer can be obtained accurately.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of extracting a parameter used for exposure, comprising:
    forming first layers each having a first parameter over substrates, respectively;
    forming second layers, each being composed of plural kinds of materials and each having a different share of the materials, on the first layers, respectively;
    forming resists on the second layers, respectively;
    performing projection processes of a first pattern and a second pattern on the resists using electron beam and forming resist patterns on each of the second layers, the first pattern having a first shape, and the second pattern having a second shape different from the first shape; and
    extracting a second parameter of each of the materials of the second layers using sizes of the resist patterns and the first parameter.

2. The method according to claim 1, wherein:
    in the extracting of the second parameter,
    a least-squares method is applied to a backward scattering intensity experimentally obtained for each of the resist patterns using the sizes of the resist patterns and the first parameter and a backward scattering intensity computationally obtained for each of the resist patterns using a lamination relation between the first layers and the second layers, and the second parameter of each of the materials of the second layers is extracted by the least-squares method.

3. The method according to claim 1, wherein:
    in the forming of the first layers, a layer composed of a single material is used as each of the first layer.

4. The method according to claim 1, wherein:
    in the forming of the resist patterns on each of the second layers,
    line and space patterns changed in the number of lines are used for the resist patterns.

5. The method according to claim 1, wherein:
    in the forming of the resist patterns on each of the second layers,
    hole patterns changed in the number of holes are used for the resist patterns.

6. The method according to claim 2, wherein:
    in the forming of the resist patterns on each of the second layers,
    doughnut patterns which respectively surround a square pattern and which are changed in width are used for the resist patterns.

7. The method according to claim 1, wherein:
    the first parameter and the second parameter are a reflection coefficient, a transmission coefficient and a diffusion length.

* * * * *